United States Patent
Cravens et al.

(10) Patent No.: US 6,704,195 B2
(45) Date of Patent: Mar. 9, 2004

(54) MICROPROCESSOR RETENTION SYSTEM AND METHOD

(75) Inventors: Zachary A. Cravens, Round Rock, TX (US); Shawn P. Hoss, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 09/950,895

(22) Filed: Sep. 10, 2001

(65) Prior Publication Data

US 2003/0165049 A1 Sep. 4, 2003

(51) Int. Cl.[7] .................................................. G06F 1/16
(52) U.S. Cl. ......................... 361/687; 361/688; 361/747
(58) Field of Search .............................. 361/688–722, 361/747, 752, 759, 784, 787, 796

(56) References Cited

U.S. PATENT DOCUMENTS

| | | | |
|---|---|---|---|
| 5,526,874 A | 6/1996 | White ........................ 165/80.3 |
| 5,748,446 A | 5/1998 | Feightner et al. ............ 361/709 |
| 5,808,236 A | * 9/1998 | Brezina et al. .............. 174/16.3 |
| 5,906,497 A | 5/1999 | Pham et al. .................. 439/160 |
| 5,910,884 A | 6/1999 | Garza et al. ................. 361/690 |
| 5,910,885 A | 6/1999 | Gulachenski et al. ........ 361/774 |
| 5,999,402 A | 12/1999 | Jeffries et al. ............... 361/687 |
| 6,025,990 A | 2/2000 | Daskalakis et al. .......... 361/704 |
| 6,031,725 A | 2/2000 | Scholder et al. ............. 361/759 |
| 6,183,285 B1 | 2/2001 | Szu ............................. 439/327 |
| 6,205,026 B1 | 3/2001 | Wong et al. ................. 361/704 |
| 6,222,734 B1 | 4/2001 | Bookhardt et al. .......... 361/719 |
| 6,229,708 B1 | * 5/2001 | Corbin, Jr. et al. .......... 361/728 |
| 6,239,974 B1 | 5/2001 | Tseng .......................... 361/704 |
| 6,243,265 B1 | 6/2001 | Wong et al. ................. 361/704 |
| 6,279,754 B1 | 8/2001 | Hoss et al. ..................... 211/26 |
| 6,437,979 B1 | * 8/2002 | Unrein ......................... 361/687 |
| 6,501,647 B1 | 12/2002 | Cepeda et al. ............... 361/687 |

* cited by examiner

Primary Examiner—Darren Schuberg
Assistant Examiner—Yean-Hsi Chang
(74) Attorney, Agent, or Firm—Baker Botts L.L.P.

(57) ABSTRACT

A microprocessor retention system and method is disclosed in which a base of a retention system is coupled to a method board. The base of the retention system includes a number of slots or openings for receiving a microprocessor and an associated heat sinks. The cover of the retention system includes a number of individually coiled springs. When the cover is secured to the base, the springs apply a compressive force to the heat sinks, placing the heat sinks in thermal contact with the associated microprocessors. The structure of the base and cover of the heat sink creates a plenum for the flow of air across the heat sinks of the microprocessor retention system.

12 Claims, 3 Drawing Sheets

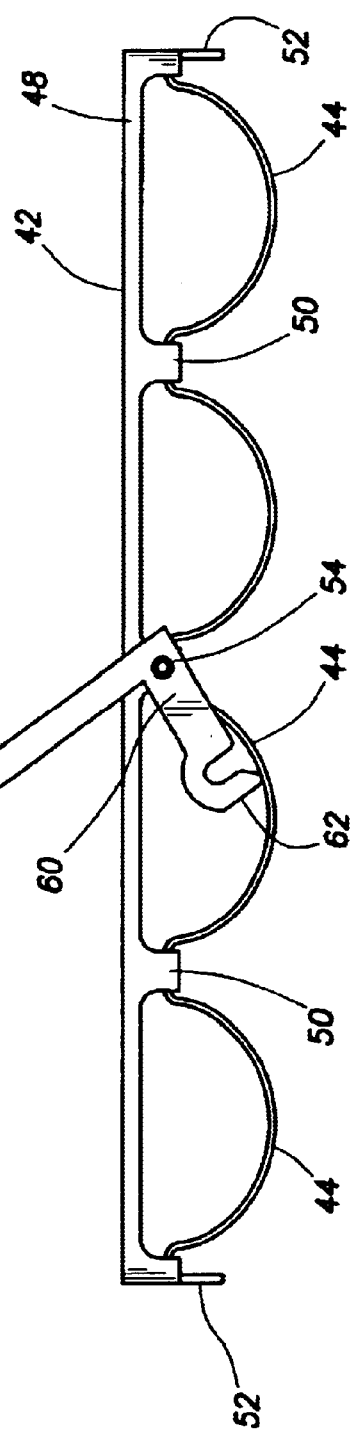
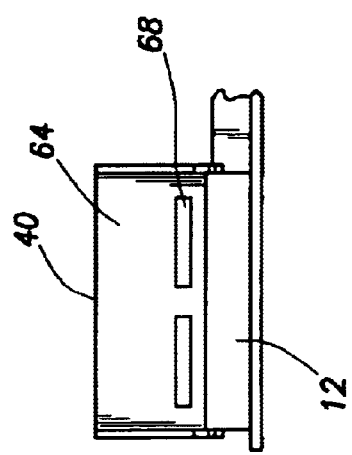

MICROPROCESSOR RETENTION SYSTEM AND METHOD

TECHNICAL FIELD

The present disclosure relates generally to the field of computer systems and, more particularly, to a microprocessor retention system.

BACKGROUND

As computer systems grow in speed and shrink in size, issues of heat dissipation and component spacing in the interior of the computer system become more important. Microprocessors generate excessive amounts of heat. The heat generated by a microprocessor is especially problematic in multiple processor systems, including many server systems, in which multiple processors are located on a single motherboard. Because most microprocessors do not have a physical structure to remove the heat generated by the microprocessor, many computer systems include a heat sink that is placed near the microprocessor to dissipate the heat generated by the microprocessor. Heat sinks are used to draw heat away from the microprocessor and the motherboard. To be most effective in dissipating heat generated by the microprocessor, a heat sink must be placed in close proximity to the surface of the microprocessor package. Even though the heat sink is placed in close proximity to the microprocessor, an air void may exist, and a thermally conductive medium in a solid or a liquid state must be physically placed between the heat sink and the microprocessor. The thermally conductive heat transfer medium minimizes the thermal resistance between the microprocessor and heat sink, allowing the heat sink more quickly draw heat away from the associated microprocessor.

Within the chassis of the computer system, microprocessor retention systems are used to maintain the position of the heat sink relative to the microprocessor. In some designs, each microprocessor is mounted individually to the printed circuit board and chassis. The practice of individually mounting of each microprocessor and associated heat sink raises several difficulties in the design and assembly of the motherboard of a computer system. Mounting each microprocessor individually on the motherboards consumes an excessive amount of space on the motherboard. Individually mounting each microprocessor involves mounting each microprocessor with its accompanying retainers and clips. As such, mounting each microprocessors in this way consumes a large amount of the limited space on the motherboard and does not take into account the economies of space afforded by mounting multiple processors as part of a single microprocessor retention system. In addition, a number of screws or other attachments must be used for each individual retention system. The use of a number of individual screws for each processor causes delays or extends the production time of each computer system. Moreover, each time that a screw is affixed to the printed circuit board or chassis of the computer system, there is a possibility that a manufacturing error will damage the printed circuit board of the computer system.

Second, mounting the microprocessor retention system to the metal chassis of the computer system causes difficulties in servicing and assembling the computer system. First, mounting a bracket or retainer of the retention system to the chassis of the computer system makes servicing or replacing the microprocessor difficult and time consuming. To service or replace the microprocessor, the retention system, in some cases, must be disconnected from its attachment to both the motherboard and the chassis of the computer system. Second, attaching a microprocessor retention system to the chassis of the computer system necessarily creates another connection point between the printed circuit board and the chassis of the computer system. In some computer systems, motherboards are mounted to the chassis of the computer system by a toolless attachment, allowing the motherboard to be easily installed in and removed from the chassis of the computer system. Mounting a microprocessor retention system to the chassis, however, eliminates this toolless removal feature in that an additional connection point is established between the motherboard and the chassis of the computer system.

SUMMARY

The microprocessor retention system of the present disclosure includes a base with a plurality of slots formed in the base for receiving a plurality of microprocessors and associated heat sinks. Each heat sink is placed on top of a microprocessor. A thermally conductive layer may be placed between the heat sink and the microprocessor. The retention system includes a cover that includes in the cover a number of springs positioned along the sides of the cover. Each heat sink is in contact with two springs of the cover of the retention system. When the cover is secured in place over the base of the retention system, the springs are compressed, resulting in the application of a compressive force to the base of the heat sink. The heat sink in turn applies a compressive force to the microprocessor, placing the microprocessor and heat sink in thermal contact, either directly or through a thermally conductive layer placed between the microprocessor and heat sink. The cover is secured over the base of the retention system by a latch mechanism coupled to the cover of the base. The latch includes hooks that engage pins in the base of the retention system. When the hooks are engaged, the springs of the cover are compressed on the base of the heat sinks.

The microprocessor retention system of the present disclosure is advantageous in that it provides a spring-loaded thermal contact between the microprocessor or microprocessors of the computer system and their associated heat sinks. When the cover of the retention system is engaged in place, the heat sinks of the retention system are held firmly against the microprocessors of the retention system, minimizing the thermal flow from the microprocessor to the heat sink. Another advantage of the retention system of the present disclosure is a retention system that does not require an attachment to the chassis of the computer system. Rather, the retention system of the present disclosure may be coupled only to the motherboard of the computer system through a minimal number of screws or other attachments.

In addition, the microprocessor retention system disclosed herein is advantageous in that the structure of the base and cover of the system provides a cover for the passage of air over and through the fins of the heat sinks of the system. Once assembled, the retention system is bounded on four sides, created a plenum for the passage of air over the heat sinks, thereby improving the ability of the retention system to dissipate heat generated by the microprocessors of the system.

Another advantage of the present invention is a latch mechanism on the cover of the system that latches the cover of the system in place on the basis while applying a relatively uniform force to the springs and heat sinks of the retention system. Another advantage of the present invention is that the arrangement of the springs and heat sinks of the retention system provides for a uniform compressive force across the base of the heat sinks. The springs of the retention system may be curved in shape, causing the springs to become bowed when a compressive force is applied to the spring. When the spring is bowed, much of the surface area of the springs is placed in contact with the surface area of the base of the heat sink, resulting in the application of a firm, uniform compressive force across the surface of the heat sinks and the respective microprocessors.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 2 is a side view of a cover of a microprocessor retention system;

FIG. 4 is a top perspective view of an assembled microprocessor retention system.

DETAILED DESCRIPTION OF THE DRAWINGS

The present disclosure concerns retention system for mounting one or more microprocessors and associated heat sinks to the motherboard of a computer. The microprocessor retention system places the microprocessors and the associated heat sinks of the computer system in close proximity or direct contact, while providing for the more efficient use of the surface area of the motherboard. The disclosed microprocessor retention system also provides a structure for cooling the heat sinks of the computer system and providing for improved assembly and servicing of the computer system.

Figure 1:
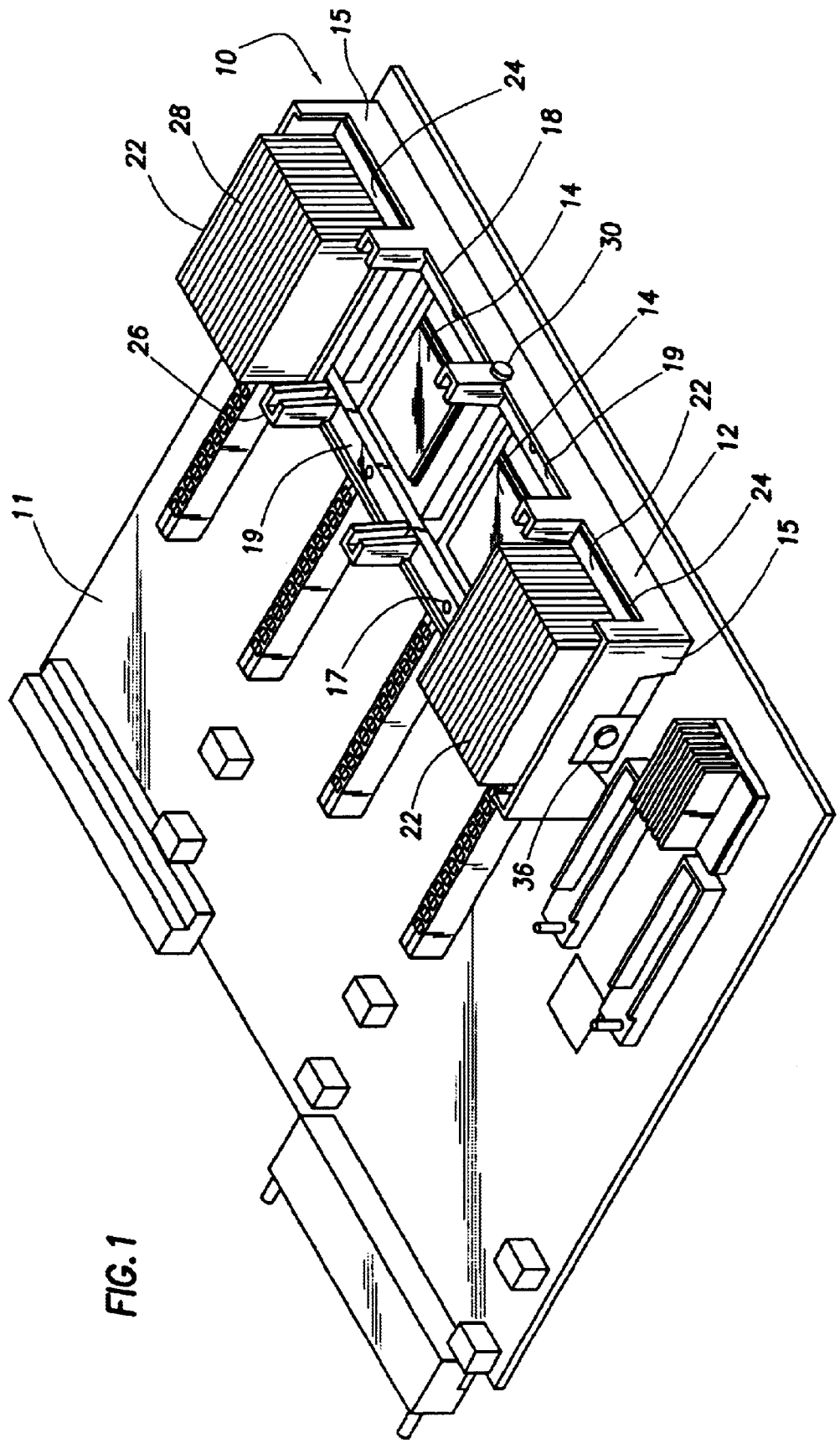
FIG. 1 is a perspective view of a partially assembled microprocessor retention system.

FIG. 1 is a perspective view of the base of a partially assembled microprocessor retention system, which is indicated generally at 10 and is mounted to a motherboard 11. Base 12 of microprocessor retention system 10 is screwed or attached in some other fashion to motherboard 11. Base 12 includes four openings or microprocessor housing slots 13. In the example of FIG. 1, the outer two of the four openings are populated by a microprocessor 14 and associated heat sink 22. The inner two of the four openings include, for the sake of illustration and example, a microprocessor 14 without an associated heat sink. In operation, one or more of the housing slots 13 of the computer system, depending on the configuration of the computer system, will include a microprocessor and an associated heat sink. In the example of FIG. 1, each housing slot 13 is square or rectangular in shape and is sized to surround the microprocessor, which is electrically coupled to the surface of the motherboard. Base 12 is typically may be made of molded plastic or a metal.

Base 12 includes longitudinal rails 18, which extend along the length of base 12. Within base 12 are posts 26. In the embodiment of FIG. 1, base 12 includes six posts 26. The number of posts 26 in base 12 will vary depending on the number of housing slots 13 in base 12. The combination of the longitudinal rails 18 and the posts 26 form the boundaries of each of the two interior housing slots 13. The boundaries of the two exterior housing slots are 13 are formed by longitudinal rails 18 and end brackets 15. Each interior side of base 12 includes a horizontal shelf 19 that is interior to each of the longitudinal rails 18. Each shelf includes a number of screw attachment points 17 for coupling base 12 to motherboard 11 of the computer system. In the embodiment of FIG. 1, four screw points 17 are shown. Four additional screw points 17 are covered by heat sinks 22 and are now shown in FIG. 1.

The top surface of each microprocessor 14 includes a thermally conductive heat transfer medium. The heat transfer medium may be a uniform surface, a thermally conductive grease, or a combination of both. When placed in a housing slot 13, the lower surface of a heat sink 22 is in close proximity to the surface of microprocessor 14. The placement of a heat transfer medium between and in contact with a heat sink and its associated microprocessor provides a physical contact for the dissipation of heat from the microprocessor. Each heat sink 22 includes fins 28 that extend from the lower surface or plate 24 of the heat sink 22. Plate 24 of the heat sink 22 is slightly longer than the width of the fins 28. Heat sink 22 is made of a metal with a high thermal conductivity.

The lower surface of each heat sink 22 rests on the top surface of microprocessor 14 or the thermally conductive heat transfer medium on the top surface of microprocessor 14. There is a slight clearance between heat sinks 22 and the horizontal shelf 19 of base 12. In the case of the heat sinks 22 in the exterior or end housing slots 13, the lateral movement of the heat sinks is limited by longitudinal rails 18, end brackets 15, and posts 26. In the case of those heat sinks positioned in the interior housing slots 13 of base 12, the lateral movement of the heat sinks is bounded by longitudinal rails 18 and posts 26. Base 12 also includes a pair of side pins 30, only one of which is shown in FIG. 1, and a single end pin 36, which is positioned one of the two end brackets 15. Each of the side pins 30 and end pins 36 extends from the surface of base 12.

FIG. 2 shows a side view of one embodiment of a cover of a microprocessor retention system, which is indicated generally at 40. Cover 40 includes a thin roof 42, which is sized to cover the entire base 12 of the microprocessor retention system. Roof 42 includes small side flanges 48 that extend in a downward direction from each side of roof 42. Front and rear flanges 52 extend in a downward direction from roof 42 and run the length of the front and rear sides of roof 42. Each side flange 48 includes a number of hooks 50. In the embodiment of FIG. 2, each side flange includes three interior hooks 50. Along each side of cover 40 a spring 44 is placed between each of the hooks 50 and between the hooks 50 and front and rear flanges 52. Each spring 44 includes a bowed or looped portion. Springs 44 may be formed of a single metal piece extending between the front and rear flanges 52. Alternatively each spring may be formed of a separate metal spring extending only between a hook 50 and the nearest hook, front flange, or rear flange. In the embodiment of FIG. 2, each spring has the shape of the lower half of an egg carton, although other shapes may be suitable for springs 44. Cover 40 includes a locking lever 46 that is coupled to cover 40 at rotation point 54. Locking lever 46 includes two arms 46. As shown in FIG. 4, arms are coupled to one another through a cross-arm 47. Locking lever 46 includes a pair of hook arms 60, each of which extends at a ninety degree angle from arm 46 and terminates in a hook 62. Hook 62 is sized to attach to side pins 30, as shown in FIG. 1. Locking lever 46 includes a locking arm 58, which is coupled to cross-arm 47 of locking lever 46 and which pivots relative to cross-arm 47.

Figure 3:
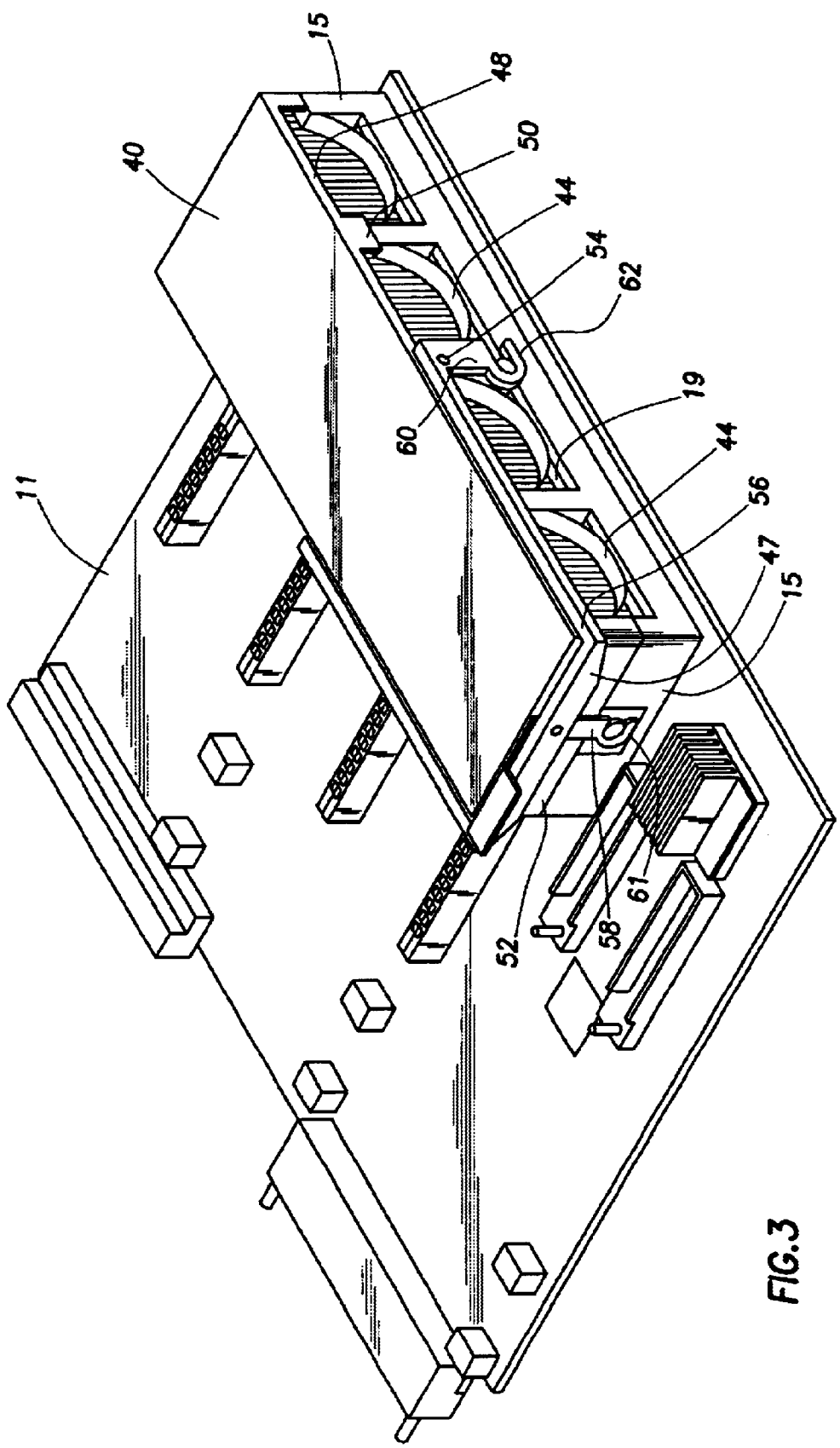
FIG. 3 is a rear view of an assembled microprocessor retention system.

FIG. 3 is a perspective view of an assembled microprocessor retention system. In FIG. 3, cover 40 has been attached to base 12 in a locked position with all four microprocessors 14 and heat sinks 22 in place in the housing slots 13 of the retention system. To put the microprocessor retention system in a locked position, base 12 must first be coupled to the motherboard. In the embodiment of the base shown in FIG. 1, base 12 is coupled to motherboard 11 with only eight screws. Following the step of attaching the base of the retention system to the motherboard, one or more microprocessor 14, depending on the configuration of the computer system, are placed in the housing slots of base 12. A thermally conductive heat transfer medium is placed on the top surface of the microprocessor. Heat sinks 22 are then placed on the top surface of each microprocessor. A heat sink 22 rests on the top surface of each microprocessor or its associated thermally conductive heat transfer medium. As cover 40 is placed on base 12, lever 46 is held in an upright position such that hooks 60 are clear of side pins 30.

Shown in FIG. 4 is a rear view of an assembled retention system, after the cover 40 being placed on base 12. To secure cover 40 to base 12, tabs 68 are inserted into slots 70 in the rear face 64 of cover 40. To further secure cover 40 to base 12, locking lever 46 is lowered toward cover 40. As shown in FIG. 3, lowering locking lever 46 causes hook 62 to rotate and engage side pin 30. Locking arm 58 can be rotated such that a hook 61 of locking arm 58 engages end pin 36. The engagement of hooks 60 and 61 with pins 30 and 36 places arms 56 causes locking lever 46 to exert a downward pressure on cover 42. The pressure exerted by the arms 56, which are co-planar with the top surface of cover 42 when the arms are in a locked position, is roughly uniform across the area of cover 42.

When cover 42 is placed in a locked position, springs 44 are pressed firmly against the top surface of the lower plates 24 of heat sinks 22. The pressure exerted by springs 44 against the heat sinks 22 causes the heat sinks to press firmly against its associated microprocessor 14 or against the thermally conductive layer that is positioned between the heat sink 22 and microprocessor 14. Springs 44 both support cover 40 and provide a structure for pressing heat sink 22 in close contact with its associated microprocessor. In the embodiment of FIG. 3, the bottom of springs 44 are bowed against the top surface of lower plates 24 of heat sinks 22, reflecting the compressive forces being absorbed by the springs and the resulting force being applied by the spring to heat sinks 22. The locking of the cover 40 to base 12—by engaging hooks 60 and 61 with the associated pins—causes springs 44 to be placed under tension, which in turn causes each heat sink 22 to be pressed firmly against its associated microprocessor. Placing each heat sink in close physical contact with its associated microprocessors assists in dissipating heat from the associated microprocessor. The amount of pressure that can be applied to the heat sinks can be adjusted by changing the size and shape of springs 44. For example, if less pressure is to be applied to microprocessors 14, springs 44 can be made smaller in size. If more pressure is to be applied to microprocessors 14, springs 44 can be larger in size. The angle of the springs may also affect the amount of force that is exerted on heat sinks 22 when the cover of the retention system is in a locked position. The placement of the compressive force on the base of the heat sinks provides for an effective platform for applying the compressive force to the heat sinks and the respective microprocessors. The bowed arrangement of the springs provides a wide surface area of contact between the springs 44 and the base of the heat sinks 12, thereby applying an uniform compressive force to the heat sinks to place the heat sinks in firm contact with the respective microprocessors.

Also, because the compressive force of the springs is applied to the base of the heat sinks, the upper portion of the heat sink, does not include spring hardware that would prevent the passage of air over the top of the heat sink or otherwise impede the dissipation of heat by the heat sink.

The structure of cover 40 aids in the cooling of microprocessors 14 because, as shown in FIG. 4, the placement of cover 40 over base 12 creates a duct or plenum that is enclosed on four sides, leaving an open area for the passage of air across the fins 28 of heat sink 22. The plenum that is formed by cover 40 and base 12 of retention system 10 is oriented such that air is directed across the fins 28 of heat sink 22, dissipating heat from heat sink 22.

In the embodiment of FIGS. 1 and 4, the microprocessors are arranged in a 1×4 matrix. Although the placement of the microprocessors along a line may, depending on the configuration of the computer system, aid in the placement or operation of buses in the motherboard of the computer system, the microprocessor may be arranged in other configurations. As an example, the microprocessor retention system disclosed herein will support the use of microprocessors that are arranged in, for example, a 2×2 or 2×3 matrix. Although the present disclosure is directed to a retention system able to accommodate multiple processors, the principles of the retention system disclosed herein could also be applied to a retention system for a single processor, in which the processor is similarly retained by a base and a cover that introduces a spring-loaded compressive force on the microprocessor and the associated heat sink.

A benefit of the disclosed retention system is a microprocessor retention system that places heat sinks in firm spring-loaded contact with the microprocessors, while permitting the flow of air across a plenum created by the retention system. Although the present disclosure has been described in detail, it should be understood that various changes, substitutions, and alterations can be made hereto without departing from the spirit and the scope of the invention as defined by the appended claims.

What is claimed is:

1. An apparatus for retaining a plurality of microprocessors, comprising:

a base having formed therein a plurality of microprocessor openings and including a microprocessor placed in each microprocessor opening;

a cover removably coupled to the base, wherein the cover and the base form an air duct that is enclosed on four sides;

a heat sink associated with and placed in contact with each microprocessor; and a spring coupled to the cover, wherein the spring exerts pressure on the base of each heat sink to force each heat sink into contact with its respective microprocessor.

2. An apparatus for retaining a plurality of microprocessors, comprising:

a base having formed therein a plurality of microprocessor openings and including a microprocessor placed in each microprocessor opening;

a cover removably coupled to the base, wherein the base and the cover include first and second sides;

a heat sink associated with and placed in contact with each microprocessor; and a set of springs coupled to each side of the cover such that the springs come into contact with each heat sink at at least two locations on each heat sink, wherein the set of springs exerts pressure on the base of each heat sink to force each heat sink into contact with its respective microprocessor.

3. The apparatus of claim 2, wherein each heat sink includes fins and a base; and wherein the set of springs is coupled to each side of the cover such that the springs come into contact with each heat sink at at least two locations on the base of each heat sink.

4. The apparatus of claim 2, wherein each set of springs is formed of a series of looped springs, wherein each looped spring includes a curved portion positioned to be in contact with the associated heat sink and wherein the number of looped springs corresponds to the number of microprocessor and associated heat sinks.

5. An apparatus for retaining a plurality of microprocessors, comprising:

a base having formed therein a plurality of microprocessor openings and including a microprocessor placed in each microprocessor opening;

a cover removably coupled to the base;

a heat sink associated with and placed in contact with each microprocessor;

a spring coupled to the cover, wherein the spring exerts pressure on the base of each heat sink to force each heat sink into contact with its respective microprocessor; and a latching mechanism rotatably coupled to the cover for coupling the cover to the base.

6. The apparatus of claim 5, wherein the latching mechanism comprises, first and second arms, each having a first end rotatably coupled to a connection point on the cover;

a cross-arm coupled between the second ends of the first and second arms;

a first hook coupled to the first end of each of the first and second arms and sized to engage a first pin on the base;

a second hook rotatably coupled to the cross-arm and sized to engage a second pin on the base; and wherein the cover is coupled to the base by rotating the first and second arms such that the first hook engages the first pin and by rotating the second hook to engage the second pin.

7. A method for assembling a microprocessor retention system in a computer system, comprising the steps of:

coupling a base of the microprocessor retention system to the motherboard of the computer system, the base having a number of slots for receiving one or more microprocessors;

placing at least one microprocessor in one of the slots of the base;

placing a heat sink having a base in contact with each microprocessor; and coupling a cover having first and second sides to the base such that a spring coupled to the cover causes a compressive force to be exerted on the base of each heat sink and the associated microprocessor in the slots of the base; wherein the spring comprises a series of individual springs positioned along each of the first and second sides of the cover and wherein each individual spring is positioned to be placed in contact with the base of a heat sink.

8. A computer system, comprising:

a housing;

a motherboard;

a base of a microprocessor retention system, the base having a plurality of slots for receiving one or more microprocessors;

one or more microprocessors located in the slots of the base;

a plurality of heat sinks, each of the heat sinks associated with and positioned near the surface of one of the microprocessors located in the slots of the base, wherein each of the heat sinks includes fins and wherein the lower surface of each heat sink comprises a base of the heat sink that extends outwardly from the fins of the heat sink; and a cover coupled to the base, wherein the cover comprises a series of individual springs and wherein pairs of individual springs are associated with and apply a compressive force to the base of each heat sink to compress the heat sink against its associated microprocessor.

9. A computer system, comprising:

a housing;

a motherboard;

a base of a microprocessor retention system, the base having a plurality of slots for receiving one or more microprocessors;

one or more microprocessors located in the slots of the base;

a plurality of heat sinks, each of the heat sinks associated with and positioned near the surface of one of the microprocessors located in the slots of the base;

a cover coupled to the base, wherein the cover includes a spring that applies a compressive force to the lower surface of the heat sinks and associated microprocessors; and a latching mechanism rotatably coupled to the cover for coupling the cover to the base.

10. The computer system of claim 9, wherein the latching mechanism comprises, first and second arms, each having a first end rotatably coupled to a connection point on the cover;

a cross-arm coupled between the second ends of the first and second arms;

a first hook coupled to the first end of each of the first and second arms and sized to engage a first pin on the base;

a second hook rotatably coupled to the cross-arm and sized to engage a second pin on the base; and wherein the cover is coupled to the base by rotating the first and second arms such that the first hook engages the first pin and by rotating the second hook to engage the second pin.

11. An apparatus for maintaining contact between microprocessors and associated heat sinks, comprising:

a base having formed therein a plurality of microprocessor openings;

a cover removably coupled to the base;

a plurality of elastic devices coupled to the cover, the elastic devices positioned relative to the base and cover such that when a microprocessor is installed in the base, and an associated heat sink is placed in contact with the microprocessor, and the cover is installed, each elastic device exerts pressure onto an associated heat sink such that contact between the heat sink and the microprocessor is maintained; and a latching mechanism rotatably coupled to the cover for coupling the cover to the base.

12. The apparatus of claim 11, wherein the latching mechanism comprises:

first and second arms, each having a first end rotatably coupled to a connection point on the cover;

a cross-arm coupled between the second ends of the first and second arms;

a first hook coupled to the first end of each of the first and second arms and sized to engage a first pin on the base; and a second hook rotatably coupled to the cross-arm and sized to engage a second pin on the base;

wherein the cover is coupled to the base by rotating the first and second arms such that the first hook engages the first pin and by rotating the second hook to engage the second pin.

* * * * *